United States Patent
Yasuda et al.

(10) Patent No.: US 10,297,485 B2
(45) Date of Patent: May 21, 2019

(54) SEMICONDUCTOR DEVICE, MAKING METHOD, AND LAMINATE

(71) Applicant: SHIN-ETSU CHEMICAL CO., LTD., Tokyo (JP)

(72) Inventors: Hiroyuki Yasuda, Annaka (JP); Michihiro Sugo, Annaka (JP); Hideto Kato, Annaka (JP); Kazunori Kondo, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/928,305

(22) Filed: Mar. 22, 2018

(65) Prior Publication Data

US 2018/0277415 A1    Sep. 27, 2018

(30) Foreign Application Priority Data

Mar. 27, 2017   (JP) ................. 2017-060638

(51) Int. Cl.
| | | |
|---|---|---|
| *H01L 23/48* | (2006.01) | |
| *H01L 21/683* | (2006.01) | |
| *H01L 23/00* | (2006.01) | |
| *H01L 23/31* | (2006.01) | |
| *C09J 161/06* | (2006.01) | |
| *H01L 21/56* | (2006.01) | |

(52) U.S. Cl.
CPC ........ *H01L 21/6835* (2013.01); *C09J 161/06* (2013.01); *H01L 21/568* (2013.01); *H01L 21/683* (2013.01); *H01L 23/3107* (2013.01); *H01L 24/19* (2013.01); *H01L 24/29* (2013.01); *H01L 24/27* (2013.01); *H01L 2221/68345* (2013.01); *H01L 2221/68359* (2013.01); *H01L 2224/03003* (2013.01); *H01L 2224/2919* (2013.01); *H01L 2224/29082* (2013.01); *H01L 2224/82005* (2013.01)

(58) Field of Classification Search
CPC .............. H01L 24/19; H01L 24/27; H01L 2221/68359; H01L 2224/03003
See application file for complete search history.

(56) References Cited

U.S. PATENT DOCUMENTS

| | | | |
|---|---|---|---|
| 2003/0064305 A1 | 4/2003 | Ono et al. | |
| 2009/0053858 A1* | 2/2009 | Ko | H01L 23/3128 438/118 |
| 2013/0292846 A1* | 11/2013 | Lee | H01L 23/538 257/774 |
| 2015/0096790 A1* | 4/2015 | Uzoh | H05K 1/0212 174/252 |
| 2015/0125993 A1* | 5/2015 | Lee | H01L 25/50 438/107 |
| 2016/0247767 A1* | 8/2016 | Kim | H01L 23/49811 |
| 2017/0069532 A1* | 3/2017 | Lee | H01L 23/5389 |
| 2017/0110393 A1* | 4/2017 | Tain | H05K 3/4673 |
| 2017/0228529 A1* | 8/2017 | Huang | G06F 21/32 |
| 2017/0263544 A1* | 9/2017 | Hiner | H01L 21/56 |
| 2017/0358507 A1* | 12/2017 | Mori | H01L 22/32 |
| 2018/0151541 A1* | 5/2018 | Jun | H01L 25/0655 |
| 2018/0277472 A1* | 9/2018 | Yasuda | C08L 63/00 |
| 2019/0048236 A1* | 2/2019 | Mori | C09J 161/34 |
| 2019/0051605 A1* | 2/2019 | Horibe | H01L 21/481 |

FOREIGN PATENT DOCUMENTS

| | | |
|---|---|---|
| JP | 2003-177528 A | 6/2003 |
| JP | 2013-58520 A | 3/2013 |
| JP | 2016-111275 A | 6/2016 |
| WO | 2015/072418 A1 | 5/2015 |

* cited by examiner

*Primary Examiner* — George R Fourson, III
(74) *Attorney, Agent, or Firm* — Westerman, Hattori, Daniels & Adrian, LLP

(57) ABSTRACT

A semiconductor device is provided comprising a support, an adhesive resin layer, an insulating layer, a redistribution layer, a chip layer, and a mold resin layer. The adhesive resin layer consists of a resin layer (A) comprising a photo-decomposable resin containing a fused ring in its main chain and a resin layer (B) comprising a non-silicone base thermoplastic resin and having a storage elastic modulus E' of 1-500 MPa at 25° C. and a tensile break strength of 5-50 MPa. The semiconductor device is easy to fabricate and has thermal process resistance, the support is easily separated, and a semiconductor package is efficiently produced.

5 Claims, No Drawings

SEMICONDUCTOR DEVICE, MAKING METHOD, AND LAMINATE

CROSS-REFERENCE TO RELATED APPLICATION

This non-provisional application claims priority under 35 U.S.C. § 119(a) on Patent Application No. 2017-060638 filed in Japan on Mar. 27, 2017, the entire contents of which are hereby incorporated by reference.

TECHNICAL FIELD

This invention relates to a semiconductor device, a method for preparing the same, and a laminate.

BACKGROUND ART

Three-dimensional semiconductor packages become essential for a higher density and capacity. The 3D semiconductor packaging technology is by thinning semiconductor chips, and stacking them in multilayer structure while providing through-silicon via (TSV) interconnects. Fabrication of such packages requires the steps of thinning a substrate having a semiconductor circuit formed therein by grinding its non-circuit forming surface or back surface, and forming TSV and electrodes on the back surface. In the prior art, prior to the step of grinding the back surface of a silicon substrate, a protective tape is attached to the surface of the substrate opposite to the surface to be ground for preventing the wafer from breakage during the grinding step. Since the protective tape is based on an organic resin film, it is flexible, but has insufficient strength and heat resistance to withstand the TSV forming step and the step of forming interconnects on the back surface.

It is then proposed to bond a semiconductor substrate to a support of silicon or glass, for example, via an adhesive layer. The resulting system is sufficient to withstand the steps of grinding the back surface and forming TSV and electrodes on the back surface. See Patent Documents 1 and 2. Although the TSV-related technology is expected as the technology for high density interconnection between chips, especially the technology for connecting a wide band memory to a processor, it is now applied only to some limited applications because of expensiveness.

Recent attention is paid to the fan-out wafer level package (FOWLP) technology as described in Patent Document 3. The FOWLP is a package of the structure that an insulated fine redistribution layer (RDL) is formed on an IC chip so as to be fanned out of the chip area. This package achieves high-density wiring between a plurality of chips and substantial reductions in size and profile over conventional packages.

Among others, a study is made on the RDL-first technique involving direct processing of RDL formation on a support substrate, placement of device chips, and resin encapsulation, in order to improve the accuracy of alignment of RDL with chips and to be applied to an application processor having numerous terminals. RDL formation and packaging must be followed by release of the support substrate. Since this technique is different from the sequence of once bonding a support substrate to a semiconductor substrate and machining the back surface of the semiconductor substrate, the adhesive system used in the TSV forming technology fails to comply with this technique.

Under the circumstances, Patent Document 4 discloses a structure including a release layer containing a laser-decomposable resin on a support and a photo-curable resin adhesive layer. The adhesive layer is cured by the heat of decomposition of the release layer by laser irradiation. In a process involving separation of the support, separation of the tape, and solvent cleaning, the cured adhesive layer is not completely removed, with residues of the cured adhesive layer being kept on the insulating layer.

CITATION LIST

Patent Document 1: JP-A 2003-177528
Patent Document 2: WO 2015/072418
Patent Document 3: JP-A 2013-058520
Patent Document 4: JP-A 2016-111275

SUMMARY OF INVENTION

An object of the invention is to provide a semiconductor device having advantages including easy preparation, thermal process resistance, easy separation of support, and increased productivity of semiconductor packages, a method for preparing the semiconductor device, and a laminate suited for preparation of the semiconductor device.

The inventors have found that the above and other objects are achieved by a semiconductor device comprising a support, an adhesive resin layer of two layer structure on the support, an insulating layer (used in forming a redistribution layer), a redistribution layer, a chip layer, and a mold resin layer, and a laminate suited for preparing of the semiconductor device.

In one aspect, the invention provides a semiconductor device comprising a support, an adhesive resin layer formed on the support, an insulating layer formed on the resin layer, a redistribution layer, a chip layer, and a mold resin layer. The adhesive resin layer consists of a resin layer (A) and a resin layer (B) disposed in order from the support side, the resin layer (A) comprising a photo-decomposable resin containing a fused ring in the main chain, the resin layer (B) comprising a non-silicone base thermoplastic resin and having a storage elastic modulus E' of 1 to 500 MPa at 25° C. and a tensile break strength of 5 to 50 MPa.

Preferably, the resin layer (A) has a transmittance of up to 20% with respect to light of wavelength 355 nm.

The resin layer (A) is preferably formed of a cured product of a resin composition (A) comprising a resin (A) comprising repeating units having the formula (1):

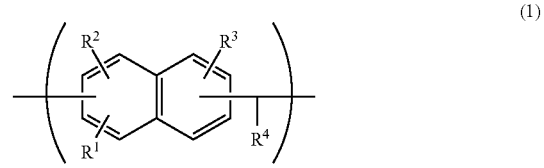

wherein $R^1$ to $R^3$ are each independently hydrogen, hydroxyl or a $C_1$-$C_{20}$ monovalent organic group, at least one of $R^1$ to $R^3$ being hydroxyl, and $R^4$ is hydrogen or an optionally substituted $C_1$-$C_{30}$ monovalent organic group.

In another aspect, the invention provides a method for preparing the semiconductor device defined above, comprising the steps of:
(a) forming the resin layer (A) directly on the support,
(b) forming the resin layer (B) on the resin layer (A),
(c) forming the insulating layer on the resin layer (B) and forming a pattern in the insulating layer, (d) forming a conductive layer on the patterned insulating layer, (e) forming a plating resist layer on the conductive layer and forming a pattern in the plating resist layer to expose the conductive layer between pattern features of the plating resist layer, (f) forming the redistribution layer on the exposed portion of the conductive layer between pattern features of the plating resist layer, (g) removing the plating resist layer to expose the conductive layer and removing the exposed conductive layer, (h) forming a second insulating layer and forming a pattern in the second insulating layer to expose the redistribution layer, (i) forming the chip layer on the redistribution layer, (j) filling an underfill agent between the chip layer and the second insulating layer, and (k) forming the mold resin layer on the chip layer.

In a further aspect, the invention provides a laminate comprising a support, an adhesive resin layer formed on the support, an insulating layer formed on the adhesive resin layer, and a plating resist layer. The adhesive resin layer consists of a resin layer (A) and a resin layer (B) disposed in order from the support side, the resin layer (A) comprising a photo-decomposable resin containing a fused ring in the main chain, the resin layer (B) comprising a non-silicone base thermoplastic resin and having a storage elastic modulus E' of 1 to 500 MPa at 25° C. and a tensile break strength of 5 to 50 MPa.

Advantageous Effects of Invention

The semiconductor device of the invention including a support, an insulating layer, and a redistribution layer is heat resistant while the layers are tightly bonded and supported. The semiconductor substrate is readily separated from the support.

DESCRIPTION OF PREFERRED EMBODIMENTS

As used herein, the notation (Cn-Cm) means a group containing from n to m carbon atoms per group.

Semiconductor Device

The semiconductor device of the invention is defined as comprising a support, an adhesive resin layer of two layer structure formed on the support, an insulating layer formed on the adhesive resin layer, a redistribution layer, a chip layer, and a mold resin layer. The adhesive resin layer consists of a resin layer (A) and a resin layer (B), disposed in the described order from the support side. The resin layer (A) comprises a photo-decomposable resin containing a fused ring in the main chain. The resin layer (B) comprises a non-silicone base thermoplastic resin and has a storage elastic modulus E' of 1 to 500 MPa at 25° C. and a tensile break strength of 5 to 50 MPa.

Support

The support may be selected from transparent substrates, silicon substrates, and ceramic substrates. Of these, the transparent substrates are preferred from the standpoint of transmission of laser light to be irradiated upon separation of the support. Suitable transparent substrates include glass substrates and quartz substrates. The support has a thickness of preferably 300 to 1,500 µm, more preferably 500 to 1,100 µm. Its shape is preferably circular or rectangular, but not limited thereto.

Adhesive Resin Layer

The adhesive resin layer consists of two layers: a resin layer (A) comprising a photo-decomposable resin and a resin layer (B) comprising a non-silicone base thermoplastic resin, disposed in the described order from the support side.

The resin layer (A) is a layer of light-shielding resin (or light-shielding layer), having a transmittance of preferably up to 20%, more preferably up to 18%, most preferably up to 15% with respect to light of wavelength 355 nm. Also preferably, the resin layer (A) has a transmittance of up to 20% with respect to light of wavelength 300 to 500 nm.

From the standpoints of heat resistance, adhesion and chemical resistance, the resin layer (A) is preferably formed of a resin containing a fused ring in the main chain. More preferably, the resin layer (A) is formed of a cured product of a resin composition (A) comprising a resin (A) comprising repeating units having the formula (1). The repeating units having formula (1) may be of one type or of two or more types.

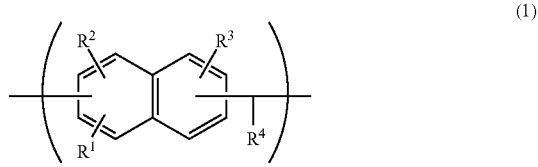

In formula (1), $R^1$ to $R^3$ are each independently hydrogen, hydroxyl or a $C_1$-$C_{20}$, preferably $C_1$-$C_{10}$ monovalent organic group. At least one of $R^1$ to $R^3$ is hydroxyl.

Suitable monovalent organic groups include $C_1$-$C_{20}$ straight, branched or cyclic alkyl groups such as methyl, ethyl, n-propyl, isopropyl, n-butyl, sec-butyl, tert-butyl, n-pentyl, neopentyl, n-hexyl, n-heptyl, n-octyl, n-nonyl, n-decyl, n-dodecyl, n-pentadecyl, n-icosyl, cyclopentyl, cyclohexyl, cyclopentylmethyl, cyclohexylmethyl, cyclopentylethyl, cyclohexylethyl, cyclopentylbutyl, cyclohexylbutyl, adamantyl; $C_1$-$C_5$ straight, branched or cyclic alkoxy groups such as methoxy; epoxy-containing groups such as glycidyloxy; and aryl groups such as phenyl and naphthyl. Of these, hydrogen, hydroxyl and methyl are preferred for $R^1$ to $R^3$.

In formula (1), $R^4$ is hydrogen or an optionally substituted $C_1$-$C_{30}$, preferably $C_1$-$C_{10}$ monovalent organic group. Suitable monovalent organic groups include alkyl, phenyl, naphthyl, anthracenyl and norbornyl groups, in which some hydrogen may be substituted by alkyl, aryl, aldehyde, halogen, nitro, nitrile or hydroxyl.

The resin (A) may be obtained by effecting polycondensation reaction of naphthol or a derivative thereof with an aldehyde compound in a solvent or solventless system in the presence of an acid or base catalyst at room temperature or while cooling or heating if desired. Hereinafter, naphthol and derivatives thereof are collectively referred to as "naphthol derivative."

Examples of the naphthol derivative include 1-naphthol, 2-naphthol, 2-methyl-1-naphthol, 4-methoxy-1-naphthol, 7-methoxy-2-naphthol, 1,2-dihydroxynaphthalene, 1,3-dihydroxynaphthalene, 2,3-dihydroxynaphthalene, 1,4-dihydroxynaphthalene, 1,5-dihydroxynaphthalene, 1,6-dihydroxynaphthalene, 2,6-dihydroxynaphthalene, 1,7-dihydroxynaphthalene, 2,7-dihydroxynaphthalene, 1,8-dihydroxynaphthalene, 5-amino-1-naphthol, 2-methoxycarbonyl-1-naphthol, 1-(4-hydroxyphenyl)naphthalene, 6-(4-hydroxyphenyl)-2-naphthol, 6-(cyclohexyl)-2- naphthol, 1,1'-bi-2-naphthol, 6,6'-bi-2-naphthol, 9,9-bis(6-hydroxy-2-naphthyl)fluorene, 6-hydroxy-2-vinylnaphthalene, 1-hydroxymethylnaphthalene, and 2-hydroxymethylnaphthalene, which may be used alone or in admixture.

The aldehyde compound used herein has the following formula:

wherein $R^4$ is as defined above.

Examples of the aldehyde compound include formaldehyde, trioxane, paraformaldehyde, acetaldehyde, propylaldehyde, adamantanecarbaldehyde, benzaldehyde, phenylacetaldehyde, α-phenylpropylaldehyde, β-phenylpropylaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, 1-naphthaldehyde, 2-naphthaldehyde, 2-hydroxy-1-naphthaldehyde, 4-hydroxy-1-naphthaldehyde, 1-hydroxy-2-naphthaldehyde, 3-hydroxy-2-naphthaldehyde, 6-hydroxy-2-naphthaldehyde, anthracenecarbaldehyde, pyrenecarbaldehyde, furfural, methylal, phthalaldehyde, isophthalaldehyde, terephthalaldehyde, naphthalenedicarbaldehyde, anthracenedicarbaldehyde, and pyrenedicarbaldehyde, which may be used alone or in admixture.

Examples of the solvent used in the polycondensation reaction include alcohols such as methanol, ethanol, isopropyl alcohol, butanol, ethylene glycol, propylene glycol, diethylene glycol, glycerol, methyl cellosolve, ethyl cellosolve, butyl cellosolve, propylene glycol monomethyl ether; ethers such as diethyl ether, dibutyl ether, diethylene glycol diethyl ether, diethylene glycol dimethyl ether, tetrahydrofuran (THF), 1,4-dioxane; chlorinated solvents such as methylene chloride, chloroform, dichloromethane, trichloroethylene; hydrocarbons such as hexane, heptane, benzene, toluene, xylene, cumene; nitriles such as acetonitrile; ketones such as acetone, ethyl methyl ketone, isobutyl methyl ketone; esters such as ethyl acetate, n-butyl acetate, propylene glycol methyl ether acetate; lactones such as γ-butyrolactone; and aprotic polar solvents such as dimethyl sulfoxide, N,N-dimethylformaldehyde, hexamethylphosphoric triamide, which may be used alone or in admixture. The solvent is preferably used in an amount of 0 to 2,000 parts by weight, more preferably 10 to 2,000 parts by weight per 100 parts by weight of the naphthol derivative and the aldehyde compound combined.

Examples of the acid catalyst used in the polycondensation reaction include mineral acids such as hydrochloric acid, hydrobromic acid, sulfuric acid, nitric acid, phosphoric acid, heteropoly-acid; organic acids such as oxalic acid, trifluoroacetic acid, methanesulfonic acid, benzenesulfonic acid, p-toluenesulfonic acid, trifluoromethanesulfonic acid; and Lewis acids such as aluminum trichloride, aluminum ethoxide, aluminum isopropoxide, boron trifluoride, boron trichloride, boron tribromide, tin tetrachloride, tin tetrabromide, dibutyltin dichloride, dibutyltin dimethoxide, dibutyltin oxide, titanium tetrachloride, titanium tetrabromide, titanium(IV) methoxide, titanium(IV) ethoxide, titanium(IV) isopropoxide, and titanium(IV) oxide.

Examples of the base catalyst used in the polycondensation reaction include inorganic bases such as sodium hydroxide, potassium hydroxide, barium hydroxide, sodium carbonate, sodium hydrogencarbonate, potassium carbonate, lithium hydride, sodium hydride, potassium hydride, calcium hydride; alkyl metal compounds such as methyllithium, n-butyllithium, methylmagnesium chloride, ethylmagnesium bromide; alkoxides such as sodium methoxide, sodium ethoxide, potassium tert-butoxide; and organic bases such as triethylamine, diisopropylethylamine, N,N-dimethylaniline, pyridine, and 4-dimethylaminopyridine.

The catalyst is preferably used in an amount of 0.001 to 100 parts by weight, more preferably 0.005 to 50 parts by weight per 100 parts by weight of the naphthol derivative and the aldehyde compound combined. The reaction temperature is preferably in a range from −50° C. to near the boiling point of the solvent, more preferably from room temperature to 100° C.

The polycondensation reaction procedure may be by charging the naphthol derivative, the aldehyde compound and the catalyst at a time, or by adding dropwise the naphthol derivative and the aldehyde compound in the presence of the catalyst.

The naphthol derivative and the aldehyde compound are preferably combined such that 0.01 to 5 moles, more preferably 0.05 to 2 moles, even more preferably 0.05 to 1 mole, and most preferably 0.1 to 0.9 mole of the aldehyde compound is present per mole of the naphthol derivative.

At the end of polycondensation reaction, unreacted reactants, catalyst and the like may be removed from within the reaction system, for example, by setting the reactor at an elevated temperature of 130 to 230° C. and under a reduced pressure of 1 to 50 mmHg for evaporating off the volatiles, by adding a proper solvent and water for fractionating the polymer, or by dissolving the polymer in a good solvent and re-precipitating it in a poor solvent. A suitable one may be chosen from these techniques depending on the nature of the reaction product.

The resin (A) preferably has a weight average molecular weight (Mw) of 500 to 500,000, more preferably 1,000 to 100,000. Also preferably the resin (A) has a dispersity (Mw/Mn) of 1.2 to 20. It is recommended to cut off monomer components, oligomer components and low-molecular-weight fractions with Mw of less than 500, because this suppresses the volatilization of volatile components during bake, preventing any contamination around the bake cup or occurrence of surface defects by re-deposition of volatile components. It is noted that Mw is measured versus polystyrene standards by gel permeation chromatography (GPC) using THF solvent.

Preferably the resin composition (A) contains a crosslinker for crosslinking the resin (A) by thermal reaction. Suitable crosslinkers include epoxy compounds or epoxy resins having two or more functional groups per molecule, and amino compounds or amino resins such as methylolmelamine. Preferably a catalyst is further added to promote crosslinking reaction of the resin (A) with the crosslinker.

Suitable epoxy compounds and epoxy resins include di, tri, tetra or poly-functional epoxy resins, for example, EOCN-1020 (identified below), EOCN-1025, XD-1000, NC-2000-L, EPPN-201, GAN, NC6000 from Nippon Kayaku Co., Ltd., and those represented by the following formulae.

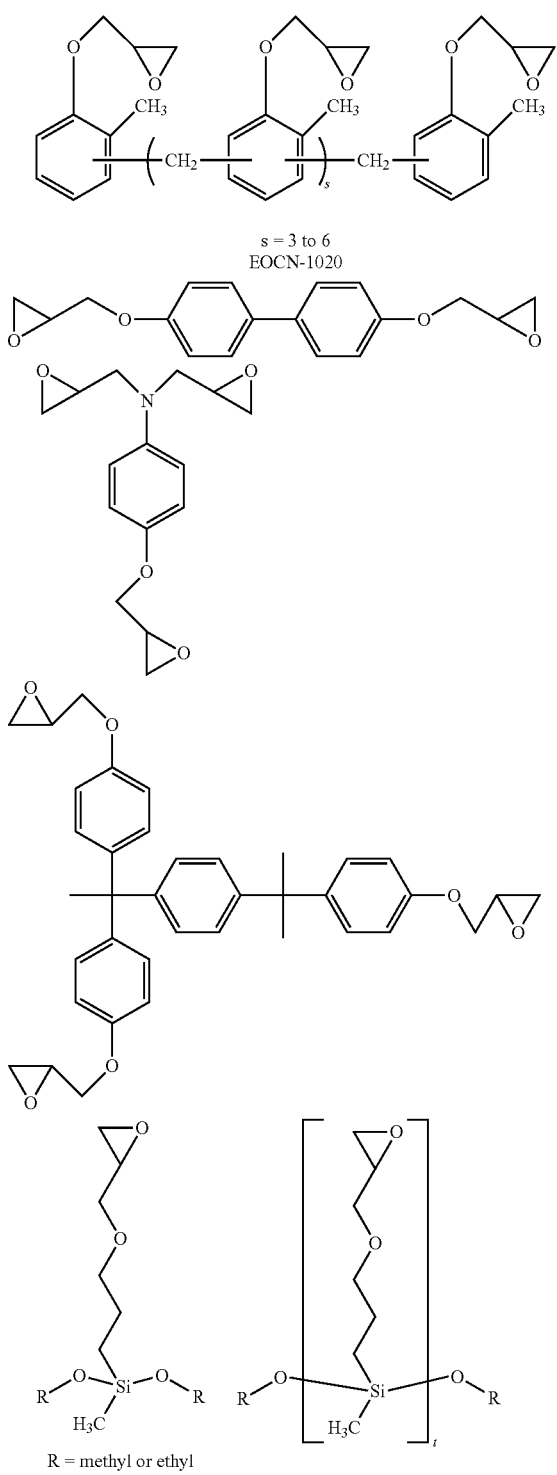

range, a sufficient crosslinking density is achieved so that the cured product may exert a full function.

When the epoxy resin is used as the crosslinker, a cure accelerator is preferably added as the catalyst. The inclusion of an epoxy resin cure accelerator ensures adequate and uniform progress of cure reaction.

Exemplary epoxy resin cure accelerators include imidazole compounds such as 2-methylimidazole, 2-ethylimidazole, 2-ethyl-4-methylimidazole, and ethyl isocyanates of the foregoing, 2-phenylimidazole, 2-phenyl-4-methylimidazole, 2-phenyl-4-methyl-5-hydroxymethylimidazole, 2-phenyl-4,5-dihydroxymethylimidazole; DBU compounds such as 1,8-diazabicyclo[5.4.0]undecane-7 (DBU), 1,5-diazabicyclo[4.3.0]nonene-5 (DBN), organic acid salts of DBU, phenolic resin salts of DBU, tetraphenyl borate salts of DBU derivatives; triorganophosphines such as triphenylphosphine, tributylphosphine, tris(p-methylphenyl)phosphine, tris(p-methoxyphenyl)phosphine, tris(p-ethoxyphenyl)phosphine, triphenylphosphine-triphenyl borate, tetraphenylphosphine-tetraphenyl borate; quaternary phosphonium salts; tertiary amines such as triethylene ammonium-triphenylborate, and tetraphenylboric acid salts thereof, which may be used alone or in admixture.

When used, the cure accelerator is preferably blended in an amount of 0.1 to 10 parts, more preferably 0.2 to 5 parts by weight per 100 parts by weight of the resin (A).

Suitable amino compounds or amino resins such as methylolmelamine include amino condensates modified with formaldehyde or formaldehyde-alcohol, and phenol compounds having on average at least two methylol or alkoxymethylol groups per molecule.

The amino compound or amino resin should preferably have a Mw of 150 to 10,000, more preferably 200 to 3,000. As long as the amino compound or resin has a Mw in the range, sufficient cure takes place and the cured composition has heat resistance.

Suitable amino condensates modified with formaldehyde or formaldehyde-alcohol include melamine condensates modified with formaldehyde or formaldehyde-alcohol and urea condensates modified with formaldehyde or formaldehyde-alcohol.

The melamine condensate modified with formaldehyde or formaldehyde-alcohol may be prepared, for example, by modifying a melamine monomer with formaldehyde into a methylol form in a well-known manner, or by further modifying it with an alcohol into an alkoxy form, i.e., into a modified melamine having the formula (2) shown below. The alcohol used herein is preferably selected from lower alcohols, typically alcohols of 1 to 4 carbon atoms.

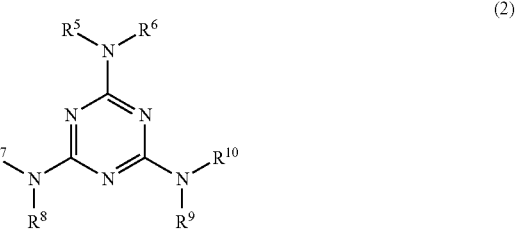

(2)

Herein $R^5$ to $R^{10}$ are each independently a methylol group, an alkoxymethyl group containing a $C_1$-$C_4$ straight, branched or cyclic alkoxy moiety, or hydrogen, at least one of $R^5$ to $R^{10}$ being methylol or alkoxymethyl.

When the epoxy compound or epoxy resin is used as the crosslinker, its amount is preferably 0.1 to 50 parts, more preferably 0.1 to 30 parts, even more preferably 1 to 30 parts by weight per 100 parts by weight of the resin (A). The crosslinker may be used alone or in admixture. As long as the amount of the epoxy compound or epoxy resin is in the Examples of the modified melamine having formula (2) include trimethoxymethylmonomethylolmelamine, dimethoxymethylmonomethylolmelamine, trimethylolmelamine, hexamethylolmelamine, and hexamethoxymethylolmelamine. Subsequently, the modified melamine or an oligomer thereof (e.g., dimer, trimer or oligomer) is subjected to addition polycondensation with formaldehyde by an ordinary technique until the desired molecular weight is reached, obtaining a melamine condensate modified with formaldehyde or formaldehyde-alcohol. At least one modified melamine condensate selected from the modified melamines and condensates thereof may be used as the crosslinker.

The urea condensate modified with formaldehyde or formaldehyde-alcohol may be prepared, for example, by modifying a urea condensate having a desired molecular weight with formaldehyde into a methylol form in a well-known manner, or further modifying it with an alcohol into an alkoxy form. Examples of the modified urea condensate include methoxymethylated urea condensates, ethoxymethylated urea condensates, and propoxymethylated urea condensates. These modified urea condensates may be used alone or in admixture.

Examples of the phenol compound having on the average at least two methylol or alkoxymethylol groups per molecule include (2-hydroxy-5-methyl)-1,3-benzenedimethanol and 2,2',6,6'-tetramethoxymethylbisphenol A.

These amino condensates or phenol compounds may be used alone or in admixture.

Where the amino compound or amino resin such as methylolmelamine is used as the crosslinker, a thermal acid generator is preferably added as the catalyst. The thermal acid generator is preferably an ammonium salt having the formula (3), but not limited thereto.

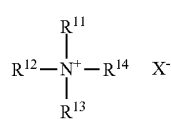

(3)

Herein $R^{11}$ to $R^{14}$ are each independently hydrogen, a $C_1$-$C_{12}$ straight, branched or cyclic alkyl group, $C_2$-$C_{12}$ straight, branched or cyclic alkenyl group, $C_6$-$C_{20}$ aryl group, or $C_7$-$C_{12}$ aralkyl group, or aryloxyalkyl group in which one or more or even all hydrogen atoms may be substituted by oxo moieties, or one or more or even all hydrogen atoms may be substituted by alkoxy moieties. Two of $R^{11}$ to $R^{14}$ may bond together to form a ring with the nitrogen atom to which they are attached, and in the case of ring formation, the ring may be a $C_3$-$C_{10}$ aliphatic ring containing the nitrogen atom therein or a $C_5$-$C_{10}$ heteroaromatic ring containing the nitrogen atom therein. $X^-$ is a sulfonate ion having at least one fluorine at α-position, perfluoroalkylimide ion or perfluoroalkylmethide ion.

Specifically, $X^-$ is selected from perfluoroalkanesulfonate anions such as triflate and nonaflate, sulfonate anions having at least one fluorine at α-position, imide anions such as bis(trifluoromethylsulfonyl)imide, bis(perfluoroethylsulfonyl)imide, and bis(perfluorobutylsulfonyl)imide, and methanide anions such as tris(trifluoromethylsulfonyl)methanide and tris(perfluoroethylsulfonyl)methanide.

When used, the thermal acid generator is preferably blended in an amount of 0.1 to 15 parts, more preferably 0.2 to 10 parts by weight per 100 parts by weight of the resin (A). Within the range, the resin composition (A) has shelf stability and fully cures.

The resin composition (A) may further contain a solvent. Examples of the solvent used herein include ketones such as cyclohexanone, cyclopentanone and methyl-2-n-pentyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, t-butyl acetate, t-butyl propionate, propylene glycol mono-t-butyl ether acetate, and γ-butyrolactone, which may be used alone or in admixture. When used, the solvent is preferably blended in an amount of 100 to 5,000 parts, more preferably 150 to 2,500 parts by weight per 100 parts by weight of the resin (A).

Alternatively, the resin composition (A) may be used as a solvent-free composition in film form.

If desired, the resin composition (A) may contain a surfactant and an antioxidant for improving heat resistance.

Although the surfactant used herein is not particularly limited, examples include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether; polyoxyethylene alkyl aryl ethers such as polyoxyethylene octyl phenol ether and polyoxyethylene nonyl phenol ether; polyoxyethylene polyoxypropylene block copolymers; sorbitan fatty acid esters such as sorbitan monolaurate, sorbitan monopalmitate and sorbitan monostearate; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP® EF301, EF303 and EF352 (Tohkem Products Co., Ltd.), Megaface® F171, F172, F173 (DIC Corp.), Fluorad® FC430 and FC431 (3M), Asahiguard AG710, Surflon® S-381, S-382, SC101, SC102, SC103, SC104, SC105, SC106, Surfynol® E1004, KH-10, KH-20, KH-30, and KH-40 (Asahi Glass Co., Ltd.); organosiloxane polymers KP341, X-70-092, X-70-093, X-70-1102 (Shin-Etsu Chemical Co., Ltd.), acrylic acid or methacrylic acid Polyflow No. 75, No. 95 (Kyoeisha Ushi Kagaku Kogyo Co., Ltd.). These surfactants may be used alone or in a combination of two or more.

The antioxidant used herein is preferably at least one compound selected from among hindered phenol compounds, hindered amine compounds, organophosphorus compounds, and organosulfur compounds.

Although the hindered phenol compounds used herein are not particularly limited, the hindered phenol compounds listed below are preferred.
1,3,5-trimethyl-2,4,6-tris(3,5-di-t-butyl-4-hydroxybenzyl) benzene (trade name: IRGANOX 1330),
2,6-di-t-butyl-4-methylphenol (trade name: Sumilizer BHT),
2,5-di-t-butylhydroquinone (trade name: Nocrac NS-7),
2,6-di-t-butyl-4-ethylphenol (trade name: Nocrac M-17),
2,5-di-t-pentylhydroquinone (trade name: Nocrac DAH),
2,2'-methylenebis(4-methyl-6-t-butylphenol) (trade name: Nocrac NS-6), 3,5-di-t-butyl-4-hydroxybenzyl phosphonate diethyl ester (trade name: IRGANOX 1222),
4,4'-thiobis(3-methyl-6-t-butylphenol) (trade name: Nocrac 300),
2,2'-methylenebis(4-ethyl-6-t-butylphenol) (trade name: Nocrac NS-5),
4,4'-butylidenebis(3-methyl-6-t-butylphenol) (Adeka Stab AO-40),
2-t-butyl-6-(3-t-butyl-2-hydroxy-5-methylbenzyl)-4-methylphenyl acrylate (trade name: Sumilizer GM),
2-[1-(2-hydroxy-3,5-di-t-pentylphenyl)ethyl]-4,6-di-t-pentylphenyl acrylate (trade name: Sumilizer GS),
2,2'-methylenebis[4-methyl-6-(α-methylcyclohexyl)phenol],
4,4'-methylenebis(2,6-di-t-butylphenol) (trade name: Seenox 226M),
4,6-bis(octylthiomethyl)-o-cresol (trade name: IRGANOX 1520L),
2,2'-ethylenebis(4,6-di-t-butylphenol),
octadecyl 3-(3,5-di-t-butyl-4-hydroxyphenyl)propionate (trade name: IRGANOX 1076),
1,1,3-tris(2-methyl-4-hydroxy-5-t-butylphenyl)butane (trade name: Adeka Stab AO-30),
tetrakis[methylene-(3,5-di-t-butyl-4-hydroxyhydrocinnamate)]methane (trade name: Adeka Stab AO-60),
triethylene glycol bis[3-(3-t-butyl-5-methyl-4-hydroxyphenyl)propionate] (trade name: IRGANOX 245),
2,4-bis(n-octylthio)-6-(4-hydroxy-3,5-di-t-butylanilino)-1,3,5-triazine (trade name: IRGANOX 565),
N,N'-hexamethylenebis(3,5-di-t-butyl-4-hydroxyhydrocinnamide) (trade name: IRGANOX 1098),
1,6-hexanediol-bis[3-(3,5-di-t-butyl-4-hydroxyphenyl)propionate] (trade name: IRGANOX 259),
2,2-thio-diethylenebis[3-(3,5-di-t-butyl-4-hydroxyphenyl)propionate] (trade name: IRGANOX 1035),
3,9-bis[2-[3-(3-t-butyl-4-hydroxy-5-methylphenyl)propionyloxy]-1,1-dimethylethyl]2,4,8,10-tetraoxaspiro[5.5]undecane (trade name: Sumilizer GA-80),
tris(3,5-di-t-butyl-4-hydroxybenzyl) isocyanurate (trade name: IRGANOX 3114),
bis(ethyl 3,5-di-t-butyl-4-hydroxybenzylphosphonate) calcium/polyethylene wax 50/50 mixture (trade name: IRGANOX 1425WL),
isooctyl 3-(3,5-di-t-butyl-4-hydroxyphenyl)propionate (trade name: IRGANOX 1135),
4,4'-thiobis(6-t-butyl-3-methylphenol) (trade name: Sumilizer WX-R),
6-[3-(3-t-butyl-4-hydroxy-5-methylphenyl)propoxy]-2,4,8,10-tetra-t-butyldibenzo-[d,f][1,3,2]dioxaphosphepin (trade name: Sumilizer GP), etc.

Although the hindered amine compounds used herein are not particularly limited, the hindered amine compounds listed below are preferred.
p,p'-dioctyldiphenylamine (trade name: IRGANOX 5057),
phenyl-α-naphthylamine (trade name: Nocrac PA),
poly(2,2,4-trimethyl-1,2-dihydroquinoline) (trade name: Nocrac 224, 224-S),
6-ethoxy-2,2,4-trimethyl-1,2-dihydroquinoline (trade name: Nocrac AW),
N,N'-diphenyl-p-phenylenediamine (trade name: Nocrac DP),
N,N'-di-β-naphthyl-p-phenylenediamine (trade name: Nocrac White),
N-phenyl-N'-isopropyl-p-phenylenediamine (trade name: Nocrac 810NA),
N,N'-diallyl-p-phenylenediamine (trade name: Nonflex TP),
4,4'-(α,α-dimethylbenzyl)diphenylamine (trade name: Nocrac CD),
p,p'-toluenesulfonylaminodiphenylamine (trade name: Nocrac TD),
N-phenyl-N'-(3-methacryloxy-2-hydroxypropyl)-p-phenylenediamine (trade name: Nocrac G1),
N-(1-methylheptyl)-N'-phenyl-p-phenylenediamine (trade name: Ozonon 35),
N,N'-di-sec-butyl-p-phenylenediamine (trade name: Sumilizer BPA),
N-phenyl-N'-1,3-dimethylbutyl-p-phenylenediamine (trade name: Antigene 6C),
alkylated diphenylamine (trade name: Sumilizer 9A),
dimethyl-1-(2-hydroxyethyl)-4-hydroxy-2,2,6,6-tetramethylpiperidine succinate polycondensate (trade name: Tinuvin 622LD),
poly[[6-(1,1,3,3-tetramethylbutyl)amino]-1,3,5-triazine-2,4-diyl][(2,2,6,6-tetramethyl-4-piperidyl)imino]hexamethylene[(2,2,6,6-tetramethyl-4-piperidyl)imino]] (trade name: CHIMASSORB 944),
N,N'-bis(3-aminopropyl)ethylenediamine-2,4-bis[N-butyl-N-(1,2,2,6,6-pentamethyl-4-piperidyl)amino]-6-chloro-1,3,5-triazine condensate (trade name: CHIMASSORB 119FL),
bis(1-octyloxy-2,2,6,6-tetramethyl-4-piperidyl)sebacate (trade name: Tinuvin 123),
bis(2,2,6,6-tetramethyl-4-piperidyl)sebacate (trade name: Tinuvin 770),
bis(1,2,2,6,6-pentamethyl-4-piperidyl) 2-(3,5-di-t-butyl-4-hydroxybenzyl)-2-n-butylmalonate (trade name: Tinuvin 144),
bis(1,2,2,6,6-pentamethyl-4-piperidyl)sebacate (trade name: Tinuvin 765),
tetrakis(1,2,2,6,6-pentamethyl-4-piperidyl) 1,2,3,4-butanetetracarboxylate (trade name: LA-57),
tetrakis(2,2,6,6-tetramethyl-4-piperidyl) 1,2,3,4-butanetetracarboxylate (trade name: LA-52),
an esterified mixture of 1,2,3,4-butanetetracarboxylic acid with 1,2,2,6,6-pentamethyl-4-piperidinol and 1-tridecanol (trade name: LA-62),
an esterified mixture of 1,2,3,4-butanetetracarboxylic acid with 2,2,6,6-tetramethyl-4-piperidinol and 1-tridecanol (trade name: LA-67),
an esterified mixture of 1,2,3,4-butanetetracarboxylic acid with 1,2,2,6,6-pentamethyl-4-piperidinol and 3,9-bis(2-hydroxy-1,1-dimethylethyl)-2,4,8,10-tetraoxaspiro[5.5]undecane (trade name: LA-63P),
an esterified mixture of 1,2,3,4-butanetetracarboxylic acid with 2,2,6,6-tetramethyl-4-piperidinol and 3,9-bis(2-hydroxy-1,1-dimethylethyl)-2,4,8,10-tetraoxaspiro[5.5]undecane (trade name: LA-68LD),
(2,2,6,6-tetramethylene-4-piperidyl)-2-propylene carboxylate (trade name: Adeka Stab LA-82),
(1,2,2,6,6-pentamethyl-4-piperidyl)-2-propylene carboxylate (trade name: Adeka Stab LA-87), etc.

Although the organophosphorus compounds used herein are not particularly limited, the organophosphorus compounds listed below are preferred.
bis(2,4-di-t-butylphenyl)[1,1-biphenyl]-4,4'-diyl bisphosphite,
9,10-dihydro-9-oxa-10-phosphaphenanthrene-10-oxide (trade name: Sanko HCA),
triethyl phosphite (trade name: JP302),
tri-n-butyl phosphite (trade name: JP304),
triphenyl phosphite (trade name: Adeka Stab TPP),
diphenyl monooctyl phosphite (trade name: Adeka Stab C),
tri(p-cresyl) phosphite (trade name: Chelex-PC), diphenyl monodecyl phosphite (trade name: Adeka Stab 135A),
diphenyl mono(tridecyl) phosphite (trade name: JPM313),
tris(2-ethylhexyl) phosphite (trade name: JP308),
phenyl didecyl phosphite (trade name: Adeka Stab 517),
tridecyl phosphite (trade name: Adeka Stab 3010),
tetraphenyl dipropylene glycol diphosphite (trade name: JPP100),
bis(2,4-di-t-butylphenyl) pentaerythritol diphosphite (trade name: Adeka Stab PEP-24G),
tris(tridecyl) phosphite (trade name: JP333E),
bis(nonylphenyl) pentaerythritol diphosphite (trade name: Adeka Stab PEP-4C),
bis(2,6-di-t-butyl-4-methylphenyl) pentaerythritol diphosphite (trade name: Adeka Stab PEP-36),
bis[2,4-di(1-phenylisopropyl)phenyl] pentaerythritol diphosphite (trade name: Adeka Stab PEP-45),
trilauryl trithiophosphite (trade name: JPS312),
tris(2,4-di-t-butylphenyl) phosphite (trade name: IRGAFOS 168),
tris(nonylphenyl) phosphite (trade name: Adeka Stab 1178),
distearyl pentaerythritol diphosphite (trade name: Adeka Stab PEP-8),
tris(mono, dinonylphenyl) phosphite (trade name: Adeka Stab 329K),
trioleyl phosphite (trade name: Chelex-OL),
tristearyl phosphite (trade name: JP318E),
4,4'-butylidene bis(3-methyl-6-t-butylphenylditridecyl) phosphite (trade name: JPH1200),
tetra(mixed $C_{12}$-$C_{15}$ alkyl)-4,4'-isopropylidene diphenyl diphosphite (trade name: Adeka Stab 1500),
tetra(tridecyl)-4,4'-butylidene bis(3-methyl-6-t-butylphenyl) diphosphite (trade name: Adeka Stab 260),
hexa(tridecyl)-1,1,3-tris(2-methyl-5-t-butyl-4-hydroxyphenyl)butane triphosphite (trade name: Adeka Stab 522A),
hydrogenated bisphenol A phosphite polymer (HBP),
tetrakis(2,4-di-t-butylphenyloxy)-4,4'-biphenylene diphosphine (trade name: P-EPQ),
tetrakis(2,4-di-t-butyl-5-methylphenyloxy) 4,4'-biphenylene diphosphine (trade name: GSY-101P),
2-[[2,4,8,10-tetrakis(1,1-dimethylethyl)dibenzo[d,f][1,3,2]dioxaphosphepin-6-yl]oxy]-N,N-bis[2-[[2,4,8,10-tetrakis(1,1-dimethylethyl)dibenzo[d,f][1,3,2]dioxaphosphepin-6-yl]oxy]-ethyl]ethanamine (trade name: IRGAFOS 12),
2,2'-methylenebis(4,6-di-t-butylphenyl)octyl phosphite (trade name: Adeka Stab HP-10), etc.

Although the organosulfur compounds used herein are not particularly limited, the organosulfur compounds listed below are preferred.
dilauryl 3,3'-thiodipropionate (trade name: Sumilizer TPL-R),
dimyristyl 3,3'-thiodipropionate (trade name: Sumilizer TPM),
distearyl 3,3'-thiodipropionate (trade name: Sumilizer TPS),
pentaerythritol tetrakis(3-laurylthiopropionate) (trade name: Sumilizer TP-D),
ditridecyl 3,3'-thiodipropionate (trade name: Sumilizer TL),
2-mercaptobenzimidazole (trade name: Sumilizer MB),
ditridecyl 3,3'-thiodipropionate (trade name: Adeka Stab AO-503A),
1,3,5-tris-β-stearylthiopropionyloxyethyl isocyanurate,
didodecyl 3,3'-thiodipropionate (trade name: IRGANOX PS 800FL),
dioctadecyl 3,3'-thiodipropionate (trade name: IRGANOX PS 802FL), etc.

Of the foregoing antioxidants, tetrakis[methylene-(3,5-di-tert-butyl-4-hydroxyhydrocinnamate)]methane is most preferred. An appropriate amount of the antioxidant added is 0.5 to 5 parts by weight, more preferably 1 to 3 parts by weight per 100 parts by weight of the resin (A). Within the range, heat resistance and compatibility are available. Notably the antioxidant is not limited to one type and a mixture of two or more types may be used.

To the resin composition (A), any well-known filler such as silica may be added in an amount of up to 50 parts by weight per 100 parts by weight of the resin (A) for further enhancing heat resistance.

The resin composition (A) in the form of a solution is applied onto a support by any suitable techniques such as spin coating, roll coating, die coating, printing, and dipping. Thereafter, the coating may be prebaked at a temperature (selected depending on the volatility of solvent), preferably of 80 to 200° C., more preferably 100 to 180° C. to volatilize off the solvent, yielding a resin composition layer (A').

In the alternative embodiment wherein the resin composition (A) is of film form, the film-form composition is applied onto a support by a laminating technique, yielding a resin composition layer (A').

Once the resin composition layer (A') is formed on a support by either of the above procedures, it is heat cured into a resin layer (A). The heat cure may be achieved by heating on a hot plate or oven, typically at a temperature of 100 to 350° C. for 5 to 10 minutes, preferably 150 to 300° C. for 3 to 8 minutes. The curing reaction is preferably performed before the resin layer (A) is overlaid with a resin layer (B).

The resin layer (A) formed on the support preferably has a thickness of 0.1 to 50 μm, more preferably 0.3 to 30 μm. As long as the thickness is in the range, the layer is sufficiently light shielding and fully flat.

Resin Layer (B)

The resin layer (B) is composed of a siloxane skeleton-free thermoplastic resin (non-silicone thermoplastic resin). From the standpoint of applicability onto the resin layer (A), a non-silicone thermoplastic resin having a satisfactory spin-coating ability is preferably used to form the thermoplastic resin layer (B). The preferred non-silicone thermoplastic resins are those resins having a glass transition temperature (Tg) of about −80° C. to about 120° C. and a Mw of 20,000 to 200,000, more preferably 30,000 to 150,000. It is noted that Tg is measured by a well-known dynamic viscoelasticity meter.

Suitable non-silicone thermoplastic resins include olefin base thermoplastic elastomers, butadiene base thermoplastic elastomers, styrene base thermoplastic elastomers, styrene-butadiene base thermoplastic elastomers, and styrene-olefin base thermoplastic elastomers. Inter alia, hydrogenated styrene base elastomers are preferred because of heat resistance. Such thermoplastic resins are commercially available as Tuftec® (Asahi Kasei Chemicals Corporation), ESPOLEX® SB Series (Sumitomo Chemical Co., Ltd.), RABALON® (Mitsubishi Chemical Corp.), SEPTON® (Kuraray Co., Ltd.), and DYNARON® (JSR Corporation). Also preferred are cycloolefin polymers as typified by ZEONEX® (ZEON Corp.) and cyclic olefin copolymers as typified by TOPAS® (Polyplastics Co., Ltd.).

The non-silicone thermoplastic resin is preferably a non-silicone thermoplastic elastomer. A laminate including a layer of the non-silicone thermoplastic elastomer allows for easy preparation of the laminate and easy clean-up of the layer after separation of the support from the laminate.

The resin layer (B) should have a storage elastic modulus E' of 1 to 500 MPa at 25° C. and a tensile break strength of 5 to 50 MPa. If E' is less than 1 MPa, there is the risk that when an insulating layer is formed on the resin layer (B), separation can occur at the interface between the resin layer (B) and the insulating layer. If E' exceeds 500 MPa, the resin layer (B) may crack at its surface. If the tensile break strength is less than 5 MPa, there is the risk that when an insulating layer is formed on the resin layer (B), separation can occur at the interface between the resin layer (B) and the insulating layer. If the tensile break strength exceeds 50 MPa, which means that the layer (B) has high rigidity, many defects may form and adhesive properties decline.

The storage elastic modulus E' at 25° C. of the resin layer (B) is preferably 5 to 300 MPa, more preferably 5 to 200 MPa, and even more preferably 10 to 150 MPa. The tensile break strength of the resin layer (B) is preferably 10 to 50 MPa. It is noted that the storage elastic modulus E' is measured by a well-known dynamic viscoelasticity meter, and the tensile break strength is measured by a well-known tensile tester.

The resin layer (B) of the above construction suppresses a possibility of separation or cracking during formation of an insulating layer thereon and ensures consistent fabrication of a laminate.

Preferably, the resin layer (B) is formed of a cured product of a resin composition (B) comprising the non-silicone thermoplastic resin.

The resin composition (B) may further contain an antioxidant for improving heat resistance, and a surfactant for facilitating coating. A typical antioxidant is di-tert-butylphenol. Suitable surfactants include fluorosilicone surfactants, for example, X-70-1102 (Shin-Etsu Chemical Co., Ltd.).

The resin composition (B) may further contain a solvent. Suitable solvents include hydrocarbon solvents such as nonane, p-menthane, pinene, isooctane, toluene, xylene and mesitylene. Inter alia, nonane, p-menthane, isooctane and mesitylene are preferred for efficient coating. The solvents may be used alone or in admixture. An appropriate amount of the solvent is 250 to 3,500 parts, more preferably 300 to 2,000 parts by weight per 100 parts by weight of the resin (B).

Alternatively, the resin composition (B) may be used as a solvent-free composition in film form.

The resin composition (B) in the form of a solution is applied onto the resin layer (A) by any suitable techniques such as spin coating, roll coating, die coating, printing, and dipping. Thereafter, the coating may be heated on a hot plate or in an oven to form a resin layer (B). Suitable heating conditions include a temperature of 100 to 200° C. for 1 to 10 minutes, more preferably 130 to 190° C. for 2 to 5 minutes.

In the alternative embodiment wherein the resin composition (B) is of film form, the resin layer (B) is formed on the resin layer (A) by a laminating technique.

The resin layer (B) preferably has a thickness of 1 to 70 µm, more preferably 2 to 50 µm. A layer thickness in the range eliminates the risk of residual solvent due to heat shortage and ensures subsequent formation of an insulating layer having improved flatness.

The remaining layers: insulating layer, redistribution layer (RDL), chip layer and mold resin layer are described below in conjunction with the method for preparing a semiconductor device.

Method for Preparing Semiconductor Device

The method for preparing a laminate includes the following steps (a) to (k).

Step (a):

Step (a) is to form a resin layer (A) having light-shielding properties on a support. In the embodiment wherein the resin composition (A) for forming the resin layer (A) is of solution form, it is applied onto the support by a suitable technique such as spin coating or roll coating. The coating is prebaked at a temperature of preferably 80 to 200° C., more preferably 100 to 180° C., depending on the volatility of the solvent, to volatilize off the solvent, for thereby forming a resin composition layer (A'). In the alternative embodiment wherein the resin composition (A) is of film form, it is laminated onto the support, yielding a resin composition layer (A').

Once the resin composition layer (A') is formed on the support, it is heat cured into resin layer (A). The heat cure may be achieved by heating on a hot plate or in an oven, typically at a temperature of 100 to 350° C., preferably 150 to 300° C. The curing time is typically 1 to 10 minutes, preferably 2 to 8 minutes.

Step (b):

Step (b) is to form a resin layer (B) on the resin layer (A). In the embodiment wherein the resin composition (B) is of solution form, it is applied onto the resin layer (A) by a suitable technique such as spin coating, roll coating, die coating, printing or dipping. The coating is then heated on a hot plate or in an oven at a temperature of 130 to 190° C. to form the resin layer (B). In the alternative embodiment wherein the resin composition (B) is of film form, it is laminated onto the resin layer (A) to form the resin layer (B).

Step (c):

Step (c) is to form an insulating layer (which is used in forming a redistribution layer) on the resin layer (B) and to form a pattern in the insulating layer. The insulating layer is formed of any materials well known in the semiconductor field, preferably resin materials, for example, epoxy resins, polyimide resins, silicone resins, modified silicone resins, polybenzoxazole (PBO), and copolymers thereof, but not limited thereto.

The insulating layer may be formed by any well-known techniques. For example, a composition containing the resin material is prepared and applied onto the resin layer (B) by a suitable coating technique such as spin coating or roll coating. Alternatively, the composition is shaped into a film and the film is stacked on the resin layer (B) by a vacuum laminating technique. After the composition is applied, it may be heated at 50 to 300° C., preferably 100 to 250° C., if necessary. In either way, the insulating layer is formed, which has a thickness of preferably 0.1 to 100 µm, more preferably 0.5 to 40 µm, and even more preferably 1 to 35 µm.

The technique of forming a pattern in the insulating layer is not particularly limited and any well-known prior art techniques may be used. For example, a pattern may be formed by photolithography. Specifically, after the insulating layer is formed, it is exposed to light and developed to form a pattern.

Step (d):

Step (d) is to form a conductive layer on the patterned insulating layer. The conductive layer may be formed, for example, by sputtering a metal such as Ti, Cu or Ti/Cu. The conductive layer is necessary later when a redistribution layer is formed. The conductive layer preferably has a thickness of 0.01 to 2 µm, more preferably 0.02 to 1 µm.

Step (e):

Step (e) is to form a plating resist layer (which is used in forming a redistribution layer) on the conductive layer and to form a pattern in the plating resist layer to expose the conductive layer between pattern features of the plating resist layer. The material of which the resist layer is formed is not particularly limited, and may be any commonly used material, preferably i-line positive tone resist material. The resist layer preferably has a thickness of about 0.1 to 100 µm. The plating resist layer may be patterned, for example, by photolithography.

Step (f):

Step (f) is to form a redistribution layer on the exposed portion of the conductive layer between pattern features of the plating resist layer. The redistribution layer may be formed by plating a metal on the conductive layer. The plating is preferably electroplating of a metal such as copper or an alloy such as copper/gold alloy or copper/nickel/gold alloy. The redistribution layer preferably has a thickness of 0.5 to 30 µm, more preferably 1.0 to 20 µm.

Step (g):

Step (g) is to remove the plating resist layer and to further remove the thus exposed conductive layer. The plating resist layer may be removed by any techniques well known in the semiconductor field, for example, by using a solvent such as cyclopentanone or propylene glycol monomethyl ether acetate. The conductive layer which is exposed after removal of the plating resist layer may also be removed by any techniques well known in the semiconductor field, for example, by using buffered hydrofluoric acid in the case of Ti, or phosphoric acid water in the case of Cu.

Step (h):

Step (g) is followed by step (h) of forming a second insulating layer, and forming a pattern in the second insulating layer to expose the redistribution layer. The second insulating layer may be formed of the same material as the insulating layer in step (c). The second insulating layer is then patterned to define openings, through which portions of the redistribution layer (which are necessary in the subsequent step of connecting chips) are exposed.

Step (i): Step (i) is to form a chip layer on the portions of the redistribution layer which are exposed through the openings in the second insulating layer. The chip layer may be formed, for example, by plating a metal (e.g., Sn, Ag, Au, Cu, Ni, Pd or Pt) or alloy thereof on a substrate to form bumps thereon, and flip connecting the bump-bearing substrate onto the redistribution layer.

Step (j):

Step (j) is to fill an underfill agent between the chip layer and the second insulating layer. The underfill agent may be introduced by any techniques well known in the semiconductor field, for example, the capillary technique of filling the space between the chip layer and the insulating layer with the underfill agent such as epoxy base material.

Step (k):

Step (k) is to form a mold resin layer on the chip layer. The structure is encapsulated with a mold material to form a desired semiconductor device. Exemplary of the mold material are materials comprising a resin such as silicone resin or epoxy resin and an inorganic filler such as silica or titanium oxide. Encapsulation may be achieved by molding the mold material, and optionally heat curing. The mold resin layer typically has a thickness of about 10 to 500 µm, but is not limited thereto.

Thereafter, the support may be released, for example, by irradiating laser light of wavelength 355 nm. After the support release, the resin layer (B) remaining on the semiconductor device is removed by solvent cleaning, yielding a desired semiconductor laminate. If any, residues on the laminate may be removed by applying oxygen plasma or the like. By further stacking such semiconductor laminates, a high-density semiconductor package is obtained.

EXAMPLE

Examples of the invention are given below by way of illustration and not by way of limitation. All parts are by weight. Mw and Mn are measured versus polystyrene standards by GPC using THF solvent. Acid generator AG used in Examples is identified below.

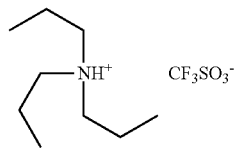

I. Preparation of Resin Composition

Preparation Example 1

A 1,000 mL flask was charged with 80 g (0.50 mol) of 1,5-dihydroxynaphthalene, 51.6 g (0.30 mol) of 6-hydroxy-2-naphthaldehyde, and 145 g of methyl cellosolve. With stirring at 70° C., 20 g of 20 wt % p-toluenesulfonic acid in methyl cellosolve was added. The solution was heated at 85° C., stirred at the temperature for 6 hours, cooled to room temperature, and diluted with 800 mL of ethyl acetate. The reaction solution was transferred to a separatory funnel and repeatedly washed each with 200 mL of deionized water to remove the reaction catalyst and metal impurities. The solution was concentrated under reduced pressure, and 600 mL of ethyl acetate was added to the residue, which was poured into 2,400 mL of hexane, allowing the polymer to precipitate. The precipitated polymer was collected by filtration and dried under reduced pressure, yielding a resin (A1) comprising repeating units of the formula shown below. The resin (A1) had a Mw of 3,200 and a dispersity (Mw/Mn) of 2.44.

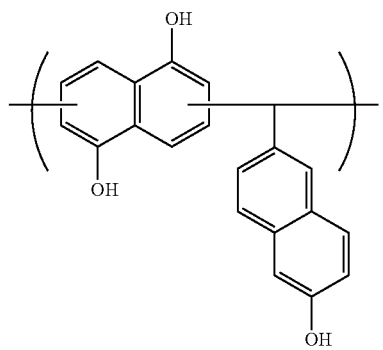

A resin composition (A1) was prepared by dissolving 20 parts of resin (A1), 1 part of acid generator AG, and 4 parts of Nikalac MW390 (Sanwa Chemical Co., Ltd.) as crosslinker in 100 parts of propylene glycol monomethyl ether acetate (PGMEA) containing 0.1 wt % of surfactant FC-4430 (3M) and passing through a fluororesin filter with a pore size of 0.1 µm.

Preparation Example 2

A 1,000-mL flask was charged with 80 g (0.50 mol) of 1,5-dihydroxynaphthalene, 9.0 g (0.30 mol) of paraformaldehyde, and 145 g of methyl cellosolve. With stirring at 70° C., 20 g of 20 wt % p-toluenesulfonic acid in methyl cellosolve was added. The solution was heated at 85° C., stirred at the temperature for 6 hours, cooled to room temperature, and diluted with 800 mL of ethyl acetate. The solution was transferred to a separatory funnel and repeatedly washed each with 200 mL of deionized water to remove the reaction catalyst and metal impurities. The solution was concentrated under reduced pressure, and 600 mL of ethyl acetate was added to the residue, which was poured into 2,400 mL of hexane, allowing a polymer to precipitate. The polymer precipitate was collected by filtration and dried under reduced pressure, yielding a resin (A2) comprising repeating units of the formula shown below. The resin (A2) had a Mw of 1,500 and a Mw/Mn of 2.20.

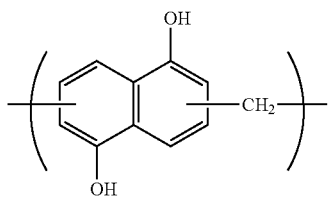

A resin composition (A2) was prepared by dissolving 20 parts of resin (A2), 1 part of acid generator AG, and 4 parts of Nikalac MW390 (Sanwa Chemical Co., Ltd.) as crosslinker in 100 parts of PGMEA containing 0.1 wt % of surfactant FC-4430 (3M) and passing through a fluororesin filter with a pore size of 0.1 μm.

Preparation Example 3

A 1,000-mL flask was charged with 72 g (0.50 mol) of 1-naphthol, 51.6 g (0.30 mol) of 6-hydroxy-2-naphthaldehyde, and 145 g of methyl cellosolve. With stirring at 70° C., 20 g of 20 wt % p-toluenesulfonic acid in methyl cellosolve was added. The solution was heated at 85° C., stirred at the temperature for 6 hours, cooled to room temperature, and diluted with 800 mL of ethyl acetate. The solution was transferred to a separatory funnel and repeatedly washed each with 200 mL of deionized water to remove the reaction catalyst and metal impurities. The solution was concentrated under reduced pressure, and 600 mL of ethyl acetate was added to the residue, which was poured into 2,400 mL of hexane, allowing a polymer to precipitate. The polymer precipitate was collected by filtration and dried under reduced pressure, yielding a resin (A3) comprising repeating units of the formula shown below. The resin (A3) had a Mw of 2,700 and a Mw/Mn of 2.61.

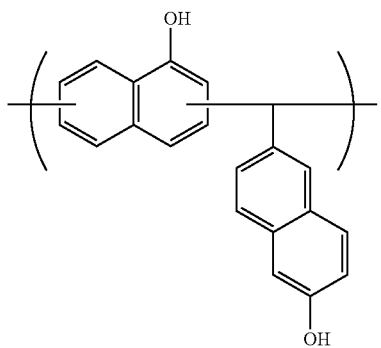

A resin composition (A3) was prepared by dissolving 20 parts of resin (A3), 1 part of acid generator AG, and 4 parts of Nikalac MW390 (Sanwa Chemical Co., Ltd.) as crosslinker in 100 parts of PGMEA containing 0.1 wt % of surfactant FC-4430 (3M) and passing through a fluororesin filter with a pore size of 0.1 μm.

Comparative Preparation Example 1

A 1,000-mL flask was charged with 32.4 g (0.30 mol) of 2-methylhydroxybenzene, 51.6 g (0.30 mol) of 6-hydroxy-2-naphthaldehyde, and 145 g of methyl cellosolve. With stirring at 70° C., 20 g of 20 wt % p-toluenesulfonic acid in methyl cellosolve was added. The solution was heated at 85° C., stirred at the temperature for 6 hours, cooled to room temperature, and diluted with 800 mL of ethyl acetate. The solution was transferred to a separatory funnel and repeatedly washed each with 200 mL of deionized water to remove the reaction catalyst and metal impurities. The solution was concentrated under reduced pressure, and 600 mL of ethyl acetate was added to the residue, which was poured into 2,400 mL of hexane, allowing a polymer to precipitate. The polymer precipitate was collected by filtration and dried under reduced pressure, yielding a resin (A4) comprising repeating units of the formula shown below. The resin (A4) had a Mw of 2,100 and a Mw/Mn of 1.58.

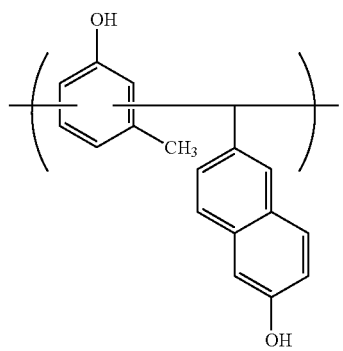

A resin composition (A4) was prepared by dissolving 20 parts of resin (A4), 1 part of acid generator AG, and 4 parts of Nikalac MW390 (Sanwa Chemical Co., Ltd.) as crosslinker in 100 parts of PGMEA containing 0.1 wt % of surfactant FC-4430 (3M) and passing through a fluororesin filter with a pore size of 0.1 μm.

Preparation Example 4

25 g of hydrogenated polystyrene base thermoplastic resin Septon® 4033 (Kuraray Co., Ltd., styrene-(ethylene/propylene)-styrene block copolymer, styrene content 30 wt %) and 25 g of hydrogenated polystyrene base thermoplastic resin Septon® 8076 (Kuraray Co., Ltd., styrene-(ethylene/butylene)-styrene block copolymer, styrene content 30 wt %) were dissolved in 150 g of mesitylene to form a mesitylene solution of 25 wt % Septon 4033/8076. The solution was passed through a membrane filter with a pore size of 0.2 μm, obtaining a resin composition (B1). The resin had a Tg of 111° C.

Preparation Example 5

25 g of hydrogenated polystyrene base thermoplastic resin Septon® 4033 (Kuraray Co., Ltd., styrene-(ethylene/propylene)-styrene block copolymer, styrene content 30 wt %) and 25 g of hydrogenated polystyrene base thermoplastic resin Septon® 2002 (Kuraray Co., Ltd., styrene-(ethylene/propylene)-styrene block copolymer, styrene content 30 wt %) were dissolved in 150 g of mesitylene to form a mesitylene solution of 25 wt % Septon 4033/2002. The solution was passed through a membrane filter with a pore size of 0.2 μm, obtaining a resin composition (B2). The resin had a Tg of 96° C.

Preparation Example 6

20 g of hydrogenated polystyrene base thermoplastic resin Septon® 4033 (Kuraray Co., Ltd., styrene-(ethylene/propylene)-styrene block copolymer, styrene content 30 wt %) and 20 g of hydrogenated polystyrene base thermoplastic resin Tuftec® H1051 (Asahi Kasei Corp., styrene-(ethylene/butylene)-styrene block copolymer, styrene content 42 wt %) were dissolved in 160 g of mesitylene to form a mesitylene solution of 20 wt % Septon 4033/Tuftec H1051. The solution was passed through a membrane filter with a pore size of 0.2 μm, obtaining a resin composition (B3). The resin had a Tg of 101° C.

Comparative Preparation Example 2

10 g of hydrogenated polystyrene base thermoplastic resin Tuftec® H1043 (Asahi Kasei Corp., styrene-(ethylene/butylene)-styrene block copolymer, styrene content 67 wt %) was dissolved in 190 g of mesitylene to form a mesitylene solution of 5 wt % Tuftec H1043. The solution was passed through a membrane filter with a pore size of 0.2 μm, obtaining a resin composition (B4). The resin had a Tg of 107° C.

Notably, the glass transition temperature (Tg) of a resin is measured as follows. Each of resin compositions (B1) to (B4) was heat cured at 180° C. for 10 minutes into a rectangular test sheet of 30 mm by 10 mm by 0.5 mm thick. The test sheet was measured for tan δ by means of a dynamic viscoelasticity meter (DMA7100 by Hitachi High-Tech Science Corp.) under conditions: frequency 1 Hz, heating rate 3° C./min, over a temperature range of 0° C. to 300° C. The peak (maximum) of tan δ was reported as Tg.

II. Preparation and Evaluation of Semiconductor Device

Examples 1 to 5 and Comparative Examples 1 to 5

The resin composition (A1), (A2), (A3) or (A4) was spin coated onto a glass plate (diameter 200 mm, thickness 500 μm) and baked on a hot plate at 180° C. for 2 minutes and then at 250° C. for 5 minutes to form a resin layer (A) to the thickness shown in Table 1.

The resin composition (B1), (B2), (B3) or (B4) was spin coated onto the resin layer (A) and heated on a hot plate at 150° C. for 5 minutes and then at 180° C. for 5 minutes to form a resin layer (B) to the thickness shown in Table 1. Notably, Comparative Example 1 included only resin layer (A), and Comparative Example 2 included only resin layer (B). Also for comparison sake, the thermoplastic polyorganosiloxane composition described in Example 1 of JP 5592330 (U.S. Pat. No. 8,735,264, EP 2578656) was prepared as resin composition (B5), which was coated to the thickness shown in Table 1.

Thereafter, the glass plates having both resin layer (A) and resin layer (B), only resin layer (A), or only resin layer (B) deposited thereon were examined by the following tests. The tests were carried out in the following order. The results are shown in Table 1.

Test 1: Repetitive Heat Resistance after Formation of Redistribution Layer and Curing of Multilayer Insulating Layer The polyimide silicone composition described in Example 2 of JP 5417623 (U.S. Pat. No. 8,673,537, EP 2333015) was spin coated on the resin layer (B) and heated at 100° C. to form an insulating layer having a thickness of 4 μm. The insulating layer was patterned by the same technique as in Example 2 of JP 5417623 and heat cured in an oven at 220° C. for 1 hour to complete the patterned insulating layer. On the insulating layer and openings therein, a Ti layer and a Cu layer were sputter deposited to a thickness of 0.05 μm and 0.20 μm, respectively. Subsequently, the positive resist composition described in Example 1 of JP 6003855 was spin coated on the Cu layer to form a plating resist layer of 10 μm thick. The plating resist layer was patterned to define openings, and Cu was deposited in the openings by electrolytic plating to form a redistribution layer (RDL) of 5 μm thick. Thereafter, the plating resist layer was removed by PGMEA washing, and the Cu layer thus exposed at the surface was etched with phosphoric acid water at room temperature for 5 minutes, and subsequently the Ti layer was etched with buffered hydrofluoric acid at room temperature for 3 minutes. Further the polyimide silicone composition (the same as above) was spin coated thereon and similarly treated to form a second insulating layer of 4 μm thick. The insulating layer was similarly patterned to define openings where the Cu redistribution layer was formed, and heat cured in an oven at 220° C. for 1 hour to complete the patterned second insulating layer.

Finally, the resulting laminate was visually observed from the glass plate side. The laminate was evaluated good (O) when no separation was found between the glass plate and the resin layer (B) or poor (X) when any anomalies were found.

Test 2: Chip Mounting on RDL and Filling of Underfill

A chip having SnAg bumps was mounted on the Cu redistribution layer of the laminate. The underfill agent described in Example 1 of JP 5579764 was filled between the chip and the insulating layer and heat cured at 120° C. for 0.5 hour and at 165° C. for 3 hours. After the curing, the laminate was visually observed from the glass plate side. The laminate was evaluated good (O) when no separation was found between the glass plate and the resin layer (B) or poor (X) when any anomalies were found.

Test 3: Molding on Chip Layer

The mold material used herein was the film-form mold resin in the form of multilayer film of release film #1/resin film/release film #2 described in Example 7 of JP-A 2016-088952 (U.S. Pat. No. 9,447,305, EP 3015499). First, release film #2 was stripped. Using a vacuum laminator model TEAM-100RF (Takatori Corp.) whose vacuum chamber was set at a vacuum of 250 Pa, the bare resin film was attached to the second insulating layer in a batch at a temperature of 110° C. After restoration of atmospheric pressure, the laminate was cooled to 25° C. and taken out of the laminator. The remaining release film #1 was stripped off. The resulting laminate was heated in an inert oven at 180° C. for 2 hours for curing the resin. Finally, the laminate was visually observed from the glass plate side. The laminate was evaluated good (O) when no separation was found between the glass plate and the resin layer (B) or poor (X) when separation was found.

Test 4: Support Separation

The support separation ability was evaluated. First, a dicing tape was applied to the mold layer of the laminate as molded in Test 3, which was mounted on a dicing frame. The dicing tape was set to the chuck platen by vacuum chucking. Thereafter, laser radiation of 355 nm was irradiated over the entire surface from the support side. The sample was evaluated good (O) when the support was separated without fissure, and poor (X) when fissure or other anomalies occurred.

Test 5: Removal by Cleaning

After the support separation test, removal by solvent cleaning was evaluated. The laminate (including the insulating layer and the mold layer) mounted on the dicing frame via the dicing tape was set on a spin coater with the resin layer (B) upside. The cleaning test used p-menthane as cleaning fluid and included 5 minutes of spraying. Rinsing was then performed by spraying isopropyl alcohol while spinning the insulating layer. The outer appearance of the laminate was visually observed for any residual resin layer (B). The sample was evaluated good (O) in the absence of residues and poor (X) in the presence of residues from the resin layer (B).

Test 6: Transmittance

Resin composition (A1), (A2), (A3) or (A4) was spin coated onto a glass plate of 500 μm thick and heat cured at 250° C. for 5 minutes to form resin layer (A) having a thickness of 0.3 The transmittance of the resin layer (A) with respect to light of wavelength 355 nm was measured by a spectrophotometer (Model U-4100 by Hitachi High-Tech Science Corp.). The sample was rated good (O) when the transmittance was up to 20% and poor (X) for a transmittance of higher than 20%.

Test 7: Measurement of Storage Elastic Modulus E'

Each of resin compositions (B1) to (B4) was heat cured at 180° C. for 10 minutes or resin composition (B5) was heated at 180° C. for 10 minutes to evaporate off the solvent, forming a rectangular test sheet of 30 mm by 10 mm by 0.5 mm thick. The test sheet was analyzed by means of a dynamic viscoelasticity meter (DMA7100 by Hitachi High-Tech Science Corp.) under conditions: frequency 1 Hz, heating rate 3° C./min, over a temperature range of 0° C. to 300° C. The value at 25° C. was reported as storage elastic modulus.

Test 8: Measurement of Tensile Break Strength

Each of resin compositions (B1) to (B4) was heat cured at 180° C. for 10 minutes or resin composition (B5) was heated at 180° C. for 10 minutes to evaporate off the solvent, forming a rectangular sheet of 200 mm by 40 mm by 0.4 mm thick. A #5 dumbbell specimen was punched out of the sheet. Using a tensile tester (V10D by Toyo Seiki Seisakusho, Ltd.), the specimen was tested at a pulling rate of 50 mm/min. The strength at breakage of the specimen was reported as tensile break strength.

Test 9: Surface State of Resin Layer (B)

Each of resin compositions (B1) to (B5) was spin coated on the glass plate having resin layer (A) coated thereon and heated on a hot plate at 150° C. for 5 minutes and then at 180° C. for 5 minutes to form a resin layer (B). The outer appearance of resin layer (B) was visually observed for surface state. The sample was evaluated good (O) when no errors were found on the surface and poor (X) when errors or cracks were found on the surface of resin layer (B).

TABLE 1

|  |  | Example | | | | | Comparative Example | | | | |
|---|---|---|---|---|---|---|---|---|---|---|---|
|  |  | 1 | 2 | 3 | 4 | 5 | 1 | 2 | 3 | 4 | 5 |
| Resin layer (A) | Resin composition | A1 | A1 | A1 | A2 | A3 | A1 | — | A4 | A3 | A3 |
|  | Thickness (μm) | 0.3 | 0.3 | 0.3 | 0.3 | 0.3 | 0.3 | — | 0.3 | 0.3 | 0.3 |
|  | Transmittance | O (7%) | O (7%) | O (7%) | O (12%) | O (9%) | O (7%) | — | X (35%) | O (9%) | O (9%) |
| Resin layer (B) | Resin composition | B1 | B2 | B3 | B3 | B3 | — | B1 | B1 | B4 | B5 |
|  | Surface state | O | O | O | O | O | — | O | O | X | O |
|  | Thickness (μm) | 30 | 30 | 30 | 30 | 30 | — | 30 | 30 | — | 31 |
|  | E' (MPa) | 23 | 25 | 130 | 130 | 130 | — | 23 | 23 | 760 | 11 |
|  | Tensile break strength (MPa) | 27 | 33 | 40 | 40 | 40 | — | 27 | 27 | 10 | 7 |
| Repetitive heat resistance |  | O | O | O | O | O | O | O | O | — | X |
| Chip mounting on RDL |  | O | O | O | O | O | O | O | O | — | — |
| Molding on chip layer |  | O | O | O | O | O | O | O | O | — | — |
| Support separation |  | O | O | O | O | O | O | X | X | — | — |
| Removal by cleaning |  | O | O | O | O | O | X | — | — | — | — |

As seen from Table 1, Examples 1 to 5 are easy in preparation of a laminate, separation of a support, and removal of a resin layer. In Comparative Example 1, residues originating from resin layer (A) were left on the insulating layer after cleaning. In Comparative Examples 2 and 3, the support could not be separated after laser irradiation, and fissure occurred. In Comparative Example 4, cracks formed after coating of resin layer (B). In Comparative Example 5, separation was found at the interface between resin to layer (B) and resin layer (A) or insulating layer after curing of the second insulating layer.

Japanese Patent Application No. 2017-060638 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A semiconductor device comprising a support, an adhesive resin layer formed on the support, an insulating layer formed on the resin layer, a redistribution layer, a chip layer, and a mold resin layer,
said adhesive resin layer consisting of a resin layer (A) and a resin layer (B) disposed in order from the support side, the resin layer (A) comprising a photo-decomposable resin containing a fused ring in the main chain, the resin layer (B) comprising a non-silicone base thermoplastic resin and having a storage elastic modulus E' of 1 to 500 MPa at 25° C. and a tensile break strength of 5 to 50 MPa.

2. The semiconductor device of claim 1 wherein the resin layer (A) has a transmittance of up to 20% with respect to light of wavelength 355 nm.

3. The semiconductor device of claim 1 wherein the resin layer (A) is formed of a cured product of a resin composition (A) comprising a resin (A) comprising repeating units having the formula (1):

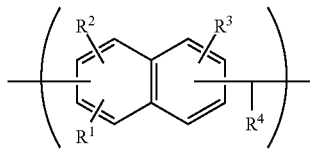

wherein $R^1$ to $R^3$ are each independently hydrogen, hydroxyl or a $C_1$-$C_{20}$ monovalent organic group, at least one of $R^1$ to $R^3$ being hydroxyl, and $R^4$ is hydrogen or an optionally substituted $C_1$-$C_{30}$ monovalent organic group.

4. A method for preparing the semiconductor device of claim 1, comprising the steps of:
(a) forming the resin layer (A) directly on the support,
(b) forming the resin layer (B) on the resin layer (A),
(c) forming the insulating layer on the resin layer (B) and forming a pattern in the insulating layer,
(d) forming a conductive layer on the patterned insulating layer,
(e) forming a plating resist layer on the conductive layer and forming a pattern in the plating resist layer to expose the conductive layer between pattern features of the plating resist layer,
(f) forming the redistribution layer on the exposed portion of the conductive layer between pattern features of the plating resist layer,
(g) removing the plating resist layer to expose the conductive layer and removing the exposed conductive layer,
(h) forming a second insulating layer and forming a pattern in the second insulating layer to expose the redistribution layer,
(i) forming the chip layer on the redistribution layer,
(j) filling an underfill agent between the chip layer and the second insulating layer, and
(k) forming the mold resin layer on the chip layer.

5. A laminate comprising a support, an adhesive resin layer formed on the support, an insulating layer formed on the adhesive resin layer, and a plating resist layer,
said adhesive resin layer consisting of a resin layer (A) and a resin layer (B) disposed in order from the support side, the resin layer (A) comprising a photo-decomposable resin containing a fused ring in the main chain, the resin layer (B) comprising a non-silicone base thermoplastic resin and having a storage elastic modulus E' of 1 to 500 MPa at 25° C. and a tensile break strength of 5 to 50 MPa.

* * * * *